United States Patent [19]

Anderson et al.

[11] Patent Number: 5,790,705
[45] Date of Patent: Aug. 4, 1998

[54] COMPRESSION TECHNIQUES FOR SUBSTANTIALLY LOSSLESS DIGITAL IMAGE DATA STORAGE

[75] Inventors: Eric C. Anderson, San Jose; George W. Dalke, Palo Alto, both of Calif.

[73] Assignee: Apple Computer, Inc., Cupertino, Calif.

[21] Appl. No.: 713,749

[22] Filed: Sep. 13, 1996

[51] Int. Cl.$^6$ .............................. G06T 9/00; H03M 7/00; H03M 7/30

[52] U.S. Cl. .............................. 382/244; 382/251; 341/55; 341/95

[58] Field of Search ................... 382/251, 244, 382/232; 341/95, 55, 50

[56] References Cited

U.S. PATENT DOCUMENTS

| | | | |
|---|---|---|---|
| 4,853,969 | 8/1989 | Weideman | 341/95 |
| 5,041,830 | 8/1991 | Abe | 341/95 |
| 5,428,567 | 6/1995 | Horvath et al. | 341/95 |

*Primary Examiner*—Scott Rogers
*Attorney, Agent, or Firm*—Sawyer & Associates

[57] ABSTRACT

A method for compressing digital image of more than a first predetermined number into the first predetermined number of bits in a substantially lossless manner includes determining a plurality of ranges in which input image data falls and comparing current image data with the plurality of ranges. The method further includes preserving a second predetermined number of bits of the current image data based upon which of the plurality of ranges the current image data falls to encode the current image data as an image value comprising the first predetermined number of bits.

A system includes means for determining a plurality of ranges in which input image data falls and means for comparing current image data with the plurality of ranges, the means for comparing coupled to the means for determining. The system further includes means for preserving a second predetermined number of bits of the current image data based upon which of the plurality of ranges the current image data falls to encode the current image data as an image value comprising the first predetermined number of bits, the means for preserving coupled to the means for determining and the means for comparing.

18 Claims, 8 Drawing Sheets

| 1 | a | b | c | d | e | f | g | x | x | Previous Data, Range 1

| 0/1 | a | b | c | d | e | f | g | x | x | Input Data within ± 252 steps

| 0 | ± | Δb | Δc | Δd | Δe | Δf | Δg | Encoded Delta ± 252 (step 4)

| 0/1 | a | b | c | d | e | f | g | ? | ? | Decoded Data

| 0 | 1 | a | b | c | d | e | f | g | x | Previous Data, Range 2

| 0/1 | 0/1 | a | b | c | d | e | f | g | x | Input Data within ± 126 steps

| 0 | ± | Δb | Δc | Δd | Δe | Δf | Δg | Encoded Delta ± 126 (step 2)

| 0/1 | 0/1 | a | b | c | d | e | f | g | ? | Decoded Data

| 0 | 0 | 0/1 | a | b | c | d | e | f | g | Previous Data, Range 3

| 0 | 0/1 | 0/1 | a | b | c | d | e | f | g | Input Data within ± 63 steps

| 0 | ± | Δb | Δc | Δd | Δe | Δf | Δg | Encoded Delta ± 63 (step 1)

| 0 | 0/1 | 0/1 | a | b | c | d | e | f | g | Decoded Data

Out of Delta Range Case

| a | b | c | d | e | f | g | x | x | x | Input Data, Outside Delta Range

| 1 | a | b | c | d | e | f | g | Encoded High Order Data Bits (step 8)

| a | b | c | d | e | f | g | 1 | 0 | 0 | Decoded Data w/bias

FIG. 5A

COMPRESSION TECHNIQUES FOR SUBSTANTIALLY LOSSLESS DIGITAL IMAGE DATA STORAGE

FIELD OF THE INVENTION

The present invention relates generally to improving digital image data storage, and more particularly to compressing digital image data for storage in byte-wide memory configurations.

BACKGROUND OF THE INVENTION

The ability to input images into computer systems has improved in recent years with the addition of image scanners and digital cameras to computer system environments. One desirable feature of these systems is that what you see on the input side of the system is accurately reproduced on the output side of the system, such as on a display device (e.g., a CRT) or printer.

In developing circuitry to produce an output image that corresponds to an input image, improved analog-to-digital converters (ADCs) have been introduced. These ADCs, in conjunction with a charge coupled device (CCD), have typically been developed to produce multi-bit digital output of image data that is greater than eight bits. The multi-bit data from the ADCs often leads to difficulties for circuitry having eight-bit or byte wide memory schemes. Such difficulties include increased bandwidth time and increased memory buffer size, which decreases the efficiency and increases the cost of the circuitry.

A common method for trying to eliminate these problems is to use a gamma correction or other non-linear correction, either prior to an ADC in the analog domain or as a series of straight line segments in the digital domain. Unfortunately, neither approach is completely recommendable. In the analog domain, the gamma correction adds noise and drifts with time and temperature. In the digital domain, gamma correction requires a look up table or more sophisticated digital logic to produce a good multi-line gamma curve. For digital approaches that use fewer line segments, data is typically lost.

Accordingly, what is needed is an efficient system that allows digital image data compression for byte-wide memory configurations to occur in a substantially lossless way. The present invention addresses such a need and eliminates visible quantizing artifacts from digital images.

SUMMARY OF THE INVENTION

The present invention provides method and system aspects that compress digital image of more than a first predetermined number into the first predetermined number of bits in a substantially lossless manner. In a method aspect, the method includes determining a plurality of ranges in which input image data falls and comparing current image data with the plurality of ranges. The method further includes preserving a second predetermined number of bits of the current image data based upon which of the plurality of ranges the current image data falls to encode the current image data as an image value comprising the first predetermined number of bits.

In a system aspect, the system includes means for determining a plurality of ranges in which input image data falls and means for comparing current image data with the plurality of ranges. The system further includes means for preserving a second predetermined number of bits of the current image data based upon which of the plurality of ranges the current image data falls to encode the current image data as an image value comprising the first predetermined number of bits.

In various embodiments of the present invention, the image value preserves six, seven, or eight bits of the current image data. In addition, the preserved data preferably reduces the number of bits of data being stored without losing discernible image data by utilizing a critical noise-quantizing factor, thus producing substantially lossless compression. Further, an efficient system results allowing digital image data compression for byte-wide memory configurations.

These and other advantages of the aspects of the present invention will be more fully understood in conjunction with the following detailed description and accompanying drawings.

BRIEF DESCRIPTION OF THE DRAWINGS

FIGS. 5a and 5b illustrate an eight-bit compression scheme and hardware system in accordance with the present invention.

DETAILED DESCRIPTION

The present invention relates to an improvement in digital image data storage through data compression techniques. The following description is presented to enable one of ordinary skill in the art to make and use the invention and is provided in the context of a patent application and its requirements. Various modifications to the preferred embodiment and the generic principles and features described herein will be readily apparent to those skilled in the art. The present invention as described herein below makes reference to compression of 10 bit digital image data to 8 bit digital image data. It should be appreciated that the description is exemplary of compression techniques of multi-bit data for byte-wide memory configurations and not restrictive of the spirit and applicability of the present invention.

Figure 1:
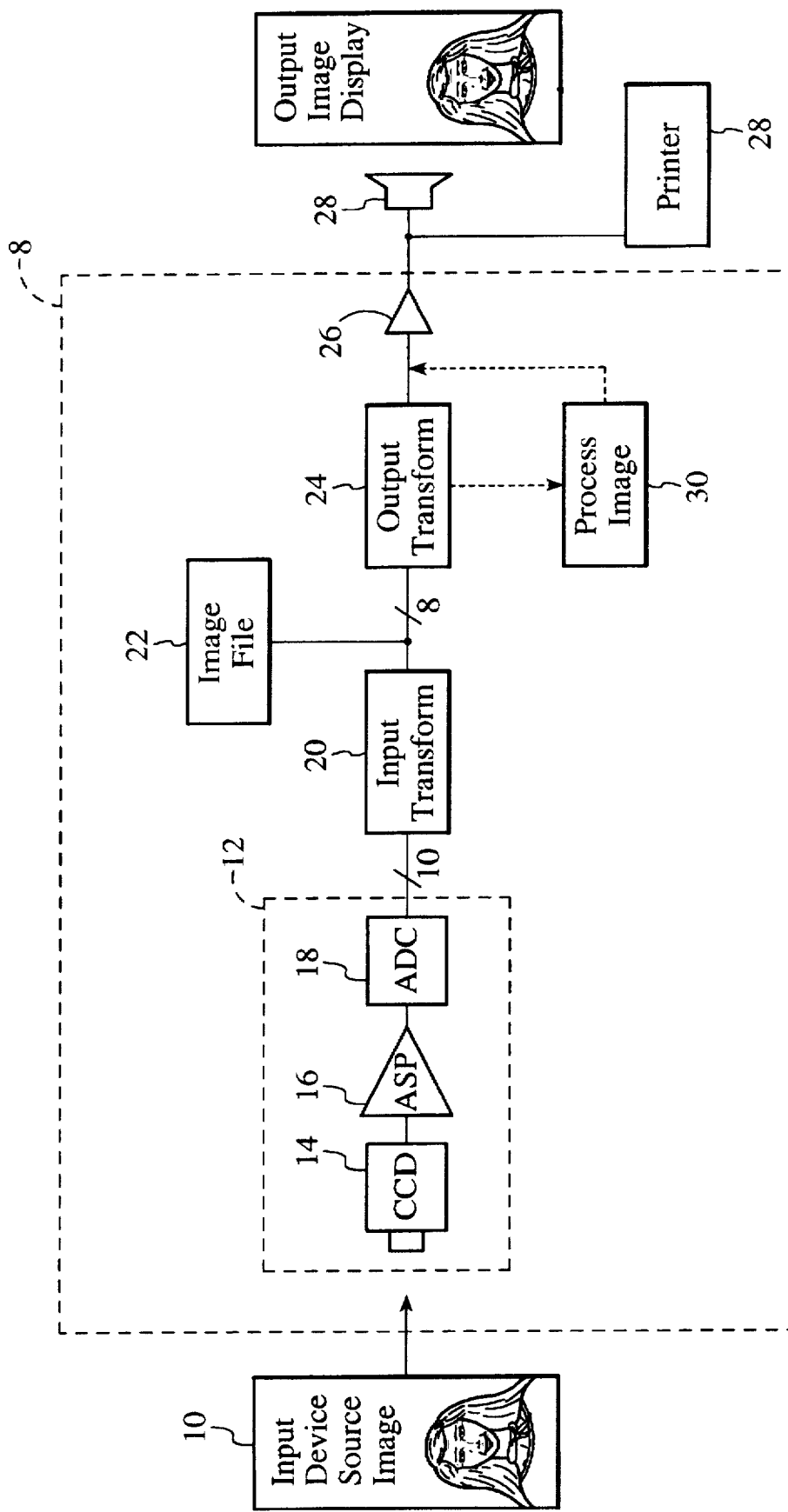
FIG. 1 illustrates a block diagram of a digital imaging system in accordance with the present invention.

FIG. 1 illustrates a schematic arrangement of a system in accordance with the present invention. A source image is input to an image/computer processing system 8 via an input device 10, such as a digital camera or scanner. A sensor 12 preferably receives the input source image and includes a CCD (charge coupled device) 14, analog signal processor (ASP) 16, and analog to digital converter (ADC) 18, as is well known to those skilled in the art.

An input transform function 20 transforms or codes the input data, e.g., 10-bit data, to image file data 22. Image file data 22 is suitably stored as 8-bit data in a storage device, such as a hard disk drive, floppy disk drive, or other storage device, with the use of compression techniques in accordance with the present invention. An output transform 24 preferably provides the inverse transform of the input function 20 concatenated with the viewing transform required by the output device, i.e., decoding of the raw image file data, to provide appropriate signals via an amplifier 26 to an output device 28, such as a CRT display or printer. In such an environment, the image file data 22 may be altered by a user, such as to change the gain, contrast or brightness of the image, as represented by block 30. Internal system image processing on raw image data, such as color correction and color reconstruction may also be performed, as is understood by those skilled in the art.

Figure 2:
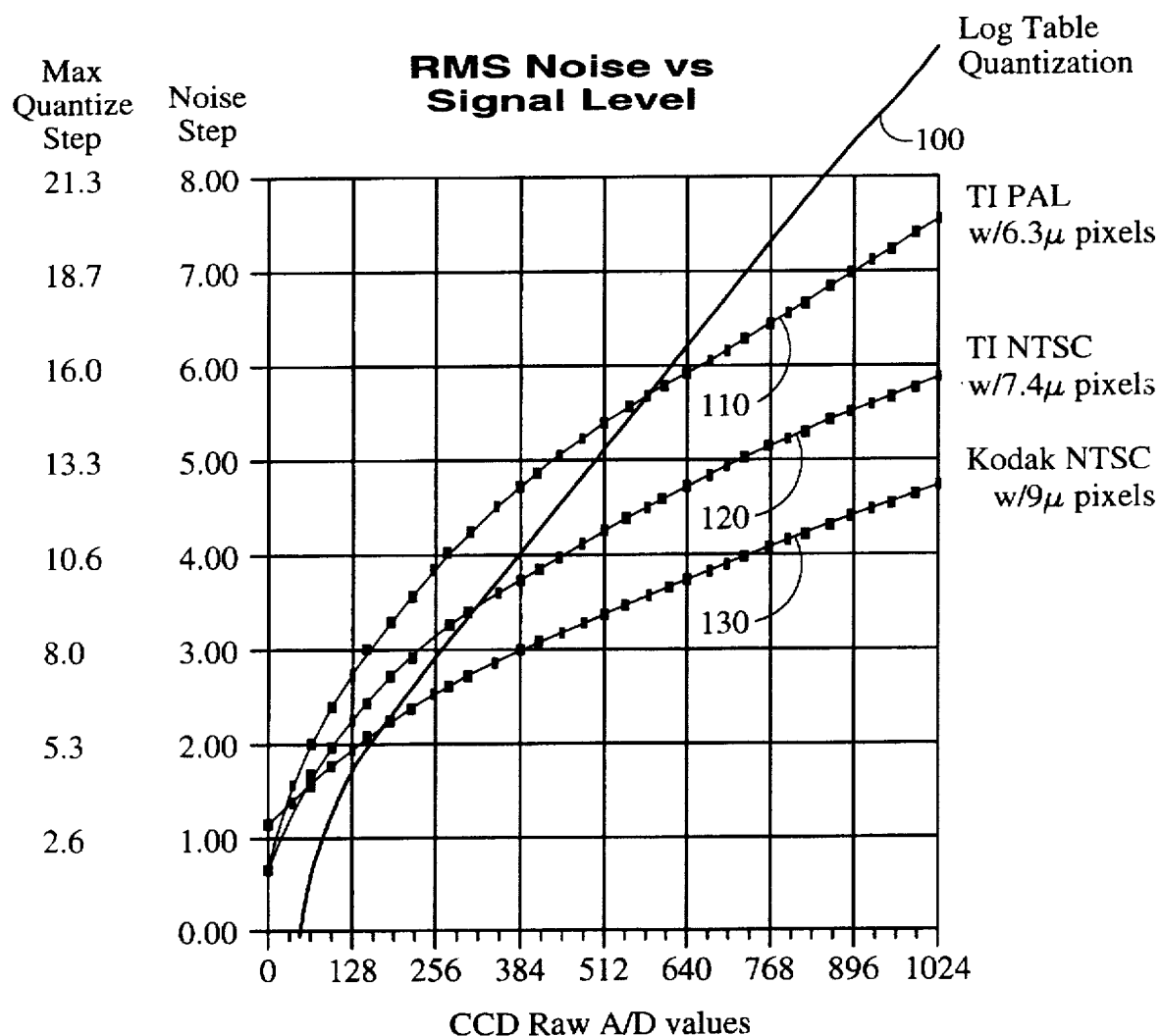
FIG. 2 illustrates a CCD noise graph for various CCDs with ASIC compression quantization levels.

In developing compression techniques for the image file data 22, characteristics of noise effects on CCD data are examined. FIG. 2 illustrates a graph of RMS noise levels versus light intensity raw data values from CCDs, where noise steps suitably refer to those levels of quantization required to equal the noise level for each light intensity level. In general, CCD data suffers from photon noise at high light levels, which keeps the signal-to-noise (S/N) ratio to around 40 decibels (dB). At low light levels, amplifier read noise in the CCD, pixel dark current problems, and inverse frequency (1/f) noise are the dominant noise components. Thus, about 40 dB is the best S/N expectable and is preferably maintained during processing for as full a range of data signal as possible.

Generally, a quantization method which goes above a selected CCD curve for a given application is losing image data. Thus, in the illustration of FIG. 2, plot 100 suitably illustrates a curve for a log quantizer that loses data at varying A/D values for three different CCD curves, represented by plots 110, 120, and 130. By way of example, the log quantizer begins losing data for the Kodak CCD (plot 130) at around 190 A/D value and higher, while for the Texas Instruments (TI) PAL sensor (plot 110), the log quantizer begins losing data when the A/D values exceed about 570. Ideally, a quantizer never quantizes above a noise quantization curve/line for a given CCD.

With a given desired or best expected noise value, a quantization factor that eliminates quantizing artifacts is suitably determined using the critical-noise quantizing factor, as described in co-pending U.S. patent application Ser. No. 08/661,524, filed Jun. 11, 1996, entitled "Elimination of Visible Quantizing Artifacts in a Digital Image", and assigned to the assignee of the present invention. Quantizing artifacts in digital images are normally characterized by contouring and banding in regions of slowly changing brightness. For color images, there may be additional banding resulting from different quantizing artifacts in each color channel. Normally, these quantizing artifacts cannot be eliminated once they are present in the digital images. Using the critical noise-quantizing factor, as described in the above-referenced application, it has been found that the quantization function is equal to ⅜ of the noise function. Thus, for a given noise function, the maximum quantization function should be ⅜ of the noise to produce an image that will have no discernible quantization artifacts. As shown in FIG. 2, the Max Quantize Step column next to the Noise Step column suitably identifies the maximum quantization step at each noise step when employing the ⅜ rule.

Figures 3A, 3B:
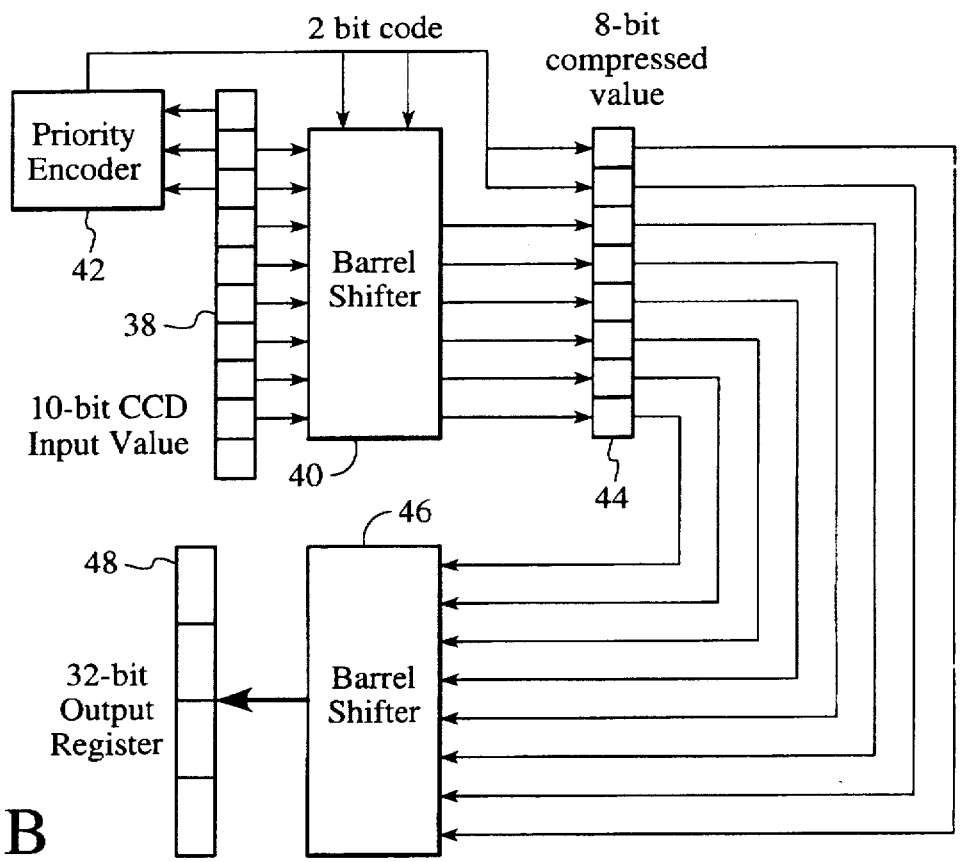
FIGS. 3a and 3b illustrate a six-bit compression scheme and hardware system in accordance with the present invention.
Figure 4A:
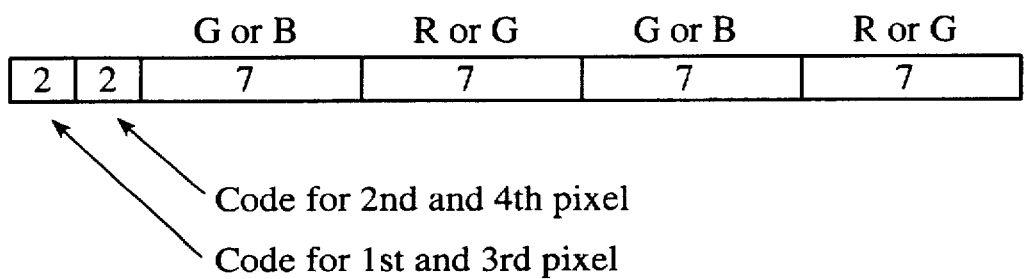
FIGS. 4a and 4b illustrate a seven-bit compression scheme and hardware system in accordance with the present invention.
Figure 4B:
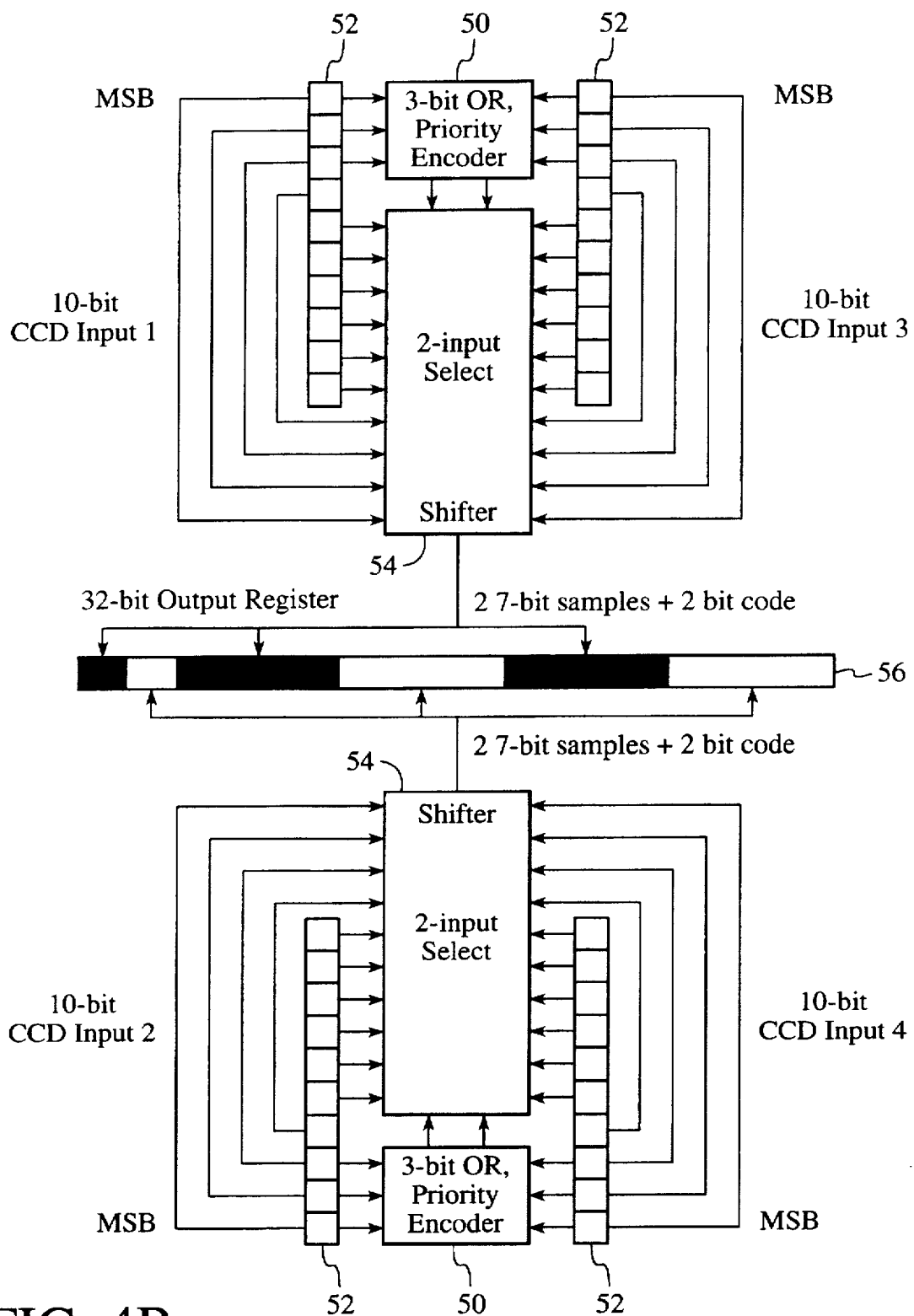
Figure 5B:
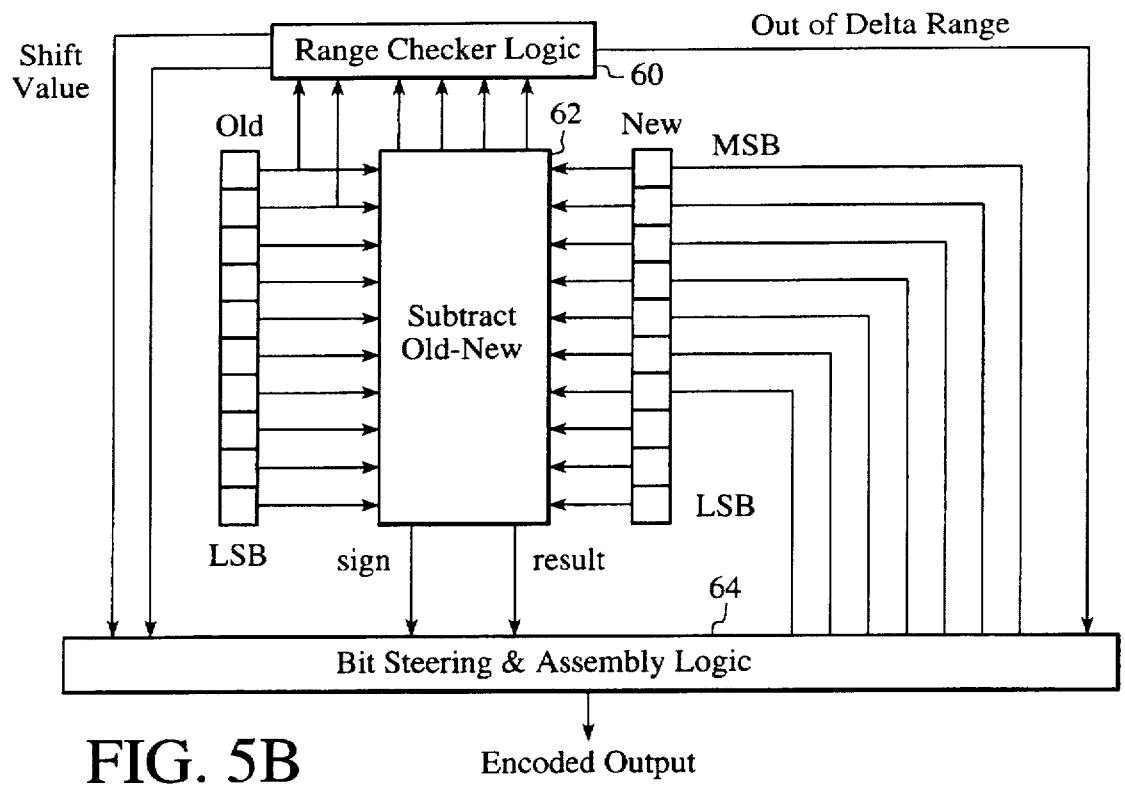
Figure 5C:
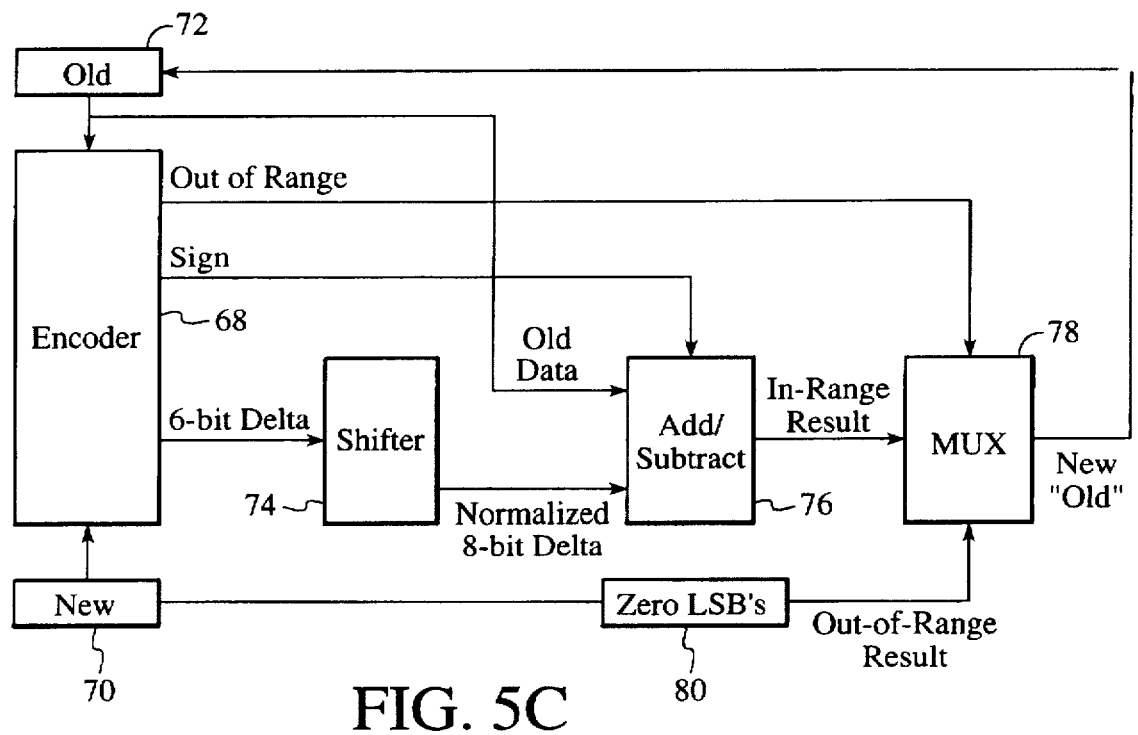
FIG. 5c illustrates a block diagram for an error correction circuit for use with the embodiment of FIGS. 5a and 5b.

With the use of the ⅜ rule to determine the amount of quantization necessary to avoid quantizing artifacts across light levels, the present invention produces multiple compression techniques that are adaptive in nature to adjust the quantization level with changes in brightness/light intensity. Thus, the data is compressed in a substantially lossless manner by reducing the number of bits of data being stored without losing discernible image data. Three preferred embodiments are presented with reference to FIGS. 3a, 3b, 4a, 4b, 5a, 5b, and 5c. FIGS. 3a, 4a, and 5a present bit diagrams for compressed and encoded data in accordance with the preferred embodiments, while FIGS. 3b, 4b, and 5b present block diagrams of the respective hardware mechanisms capable of producing the compressed and encoded data. FIG. 5c illustrates an error correction circuit suitably utilized in conjunction with the embodiment of FIGS. 5a and 5b.

One suitable method for compressing image data from 10 bits to 8 bits is described with reference to FIGS. 3a and 3b. As shown in FIG. 3a, using the first to third most significant bits (MSBs) of the CCD data for each pixel of an image, the incoming data is determined to be in one of four ranges of the light intensity scale, e.g., 0-1023. When the MSB is a one, the data is in the upper half of the data range, e.g., 512-1023. To form compressed data, the six bits of the CCD data following the MSB, represented by a, b, c, d, e, and f, are shifted to the right one bit, the three least significant bits (LSBs), 'xxx', are not considered, and the two MSBs of the compressed data are set to one. With the three LSBs of CCD data not considered, there is a quantization step value of eight.

When the two MSBs of CCD data are a zero-one, '01', sequence, the data falls in the second quarter (256-511) of the light value range. The subsequent six bits a–f of the CCD data are preserved, and the two LSBs are not considered. The two MSBs of the compressed data are set to a '10'. With the two LSBs of the CCD data not considered, there is a quantization step value of four.

When the three MSBs are a '001', the CCD data falls in the second eighth (128-255) of the light value range. The CCD data, bits a-f, is suitably shifted to the left one bit to form the eight bit compressed data value with the MSB and LSB of the CCD data not considered. With only the LSB of the data value not considered, there is a quantization step value of two. The two MSBs of the compressed data are suitably a '10' sequence.

When the three MSBs of the CCD data are all zero, the data falls in the first eighth (0-127) of the light value range. Again, the CCD data bits a-f are shifted to the left one bit, and the MSB and LSB of the CCD data not considered. Once again the quantization step value is two. The two MSBs are suitably a '00' sequence.

With the formation of the compressed data values, four consecutive pixels, each represented by an eight bit compressed value, are suitably placed in a 32-bit wide memory word. The placement of four consecutive pixels into a 32-bit word in memory comprises placement of a two bit code, i.e., the 11, 10, 01, or 00 designation of the two MSBs, followed by the six bits a-f of preserved CCD data value. When decoding the compressed data value, the two bit code suitably indicates how the data should be shifted back to restore the position of the data bits. Preferably, the discarded LSBs in this embodiment and the other embodiments as described hereinbelow are set to a value that would bias the decompressed data at a halfway point in the light range, as is well appreciated by those skilled in the art.

FIG. 3b illustrates a hardware mechanism suitable for achieving the six bit compression scheme of FIG. 3a. As shown, a ten-bit CCD data value 38 is input into a barrel shifter 40. The top three bits of the CCD data value are also input into a priority encoder 42. The priority encoder 42 in turn suitably determines which two bit code should be input into the barrel shifter 40 to determine how many bits of shifting are necessary. The two bit code also becomes two bits of the output 8-bit compressed value 44. The compressed data value 44 is then passed through a second barrel shifter 46 to place the two bit code as the two MSBs of the eight bit value for storage in the 32-bit memory storage 48 and as previously described with reference to FIG. 3a. Alternatively, the data is latched into one of four 8-bit latches to effect the same result.

FIGS. 4a and 4b illustrate an alternate compression scheme which maintains seven bits of an original ten bit data value. Again, ranges of the CCD data values are determined using one to three of the MSBs of the CCD data value. Referring to FIG. 4a, when the three MSBs of the CCD data value are zeroes, the CCD data falls in the first eighth (0-127) of the light value range. The next seven bits of CCD data, represented by a, b, c, d, e, f, and g, are preserved and the MSB of the compressed data represents a code for a '00' value. Since no bit values of the CCD data are discarded, the quantization step value is one.

When only the 2 MSBs of the CCD data value are zeroes, the CCD data falls in the next eighth of the light value range (128-255). The next seven bits of the CCD data, a-g, are preserved in the compressed data by shifting the CCD data to the right one bit and discarding the LSB, 'x', of the CCD data. The MSB of the compressed data suitably represents a '01' code. Since the LSB of the CCD data is discarded, the quantization step value is two.

When only the MSB of the CCD data is a zero, the CCD data falls in the next quarter of the light value range (256-511). The next seven bits of the CCD data, a-g, are preserved by shifting the CCD data to the right two bits and the two LSBs of the CCD data are discarded. A code representing a '10' value is held in the MSB of the compressed data. Since the last two bits are discarded, the quantization step value is four.

When there is no leading zero bit, the data value falls in the last half (512-1023) of the light value range. The seven MSBs of the CCD data, a-g, are preserved by shifting them to the right three bits, and the MSB of the compressed data value represents a code for a '11' value. The last three bits of the CCD data, 'xxx', are discarded resulting in a quantization step value of eight.

In forming a 32-bit word with the compressed data, a four pixel sequence is used. In a Bayer pattern of image data, a line of pixels of green-red-green-red, etc., is followed by a line of pixels of blue-green-blue-green, etc., for each line pair data across the image. A 32-bit word is thus suitably divided to hold four pixels of data, as shown in FIG. 4a. The four pixels are divided such that the four MSBs represent two, two-bit codes that are associated with alternate subsequent sets of seven bits. For the Bayer pattern sequence, the first and third pixels of four consecutive pixels, e.g., green-green or blue-blue, are more similar, while the second and fourth pixels, e.g., red-red or green-green, are more similar. Thus, the two MSBs suitably code the data for the first and third set of seven bits, while the next two MSBs code the data for the second and fourth set of seven bits in the 32-bit word. This grouping of two pixels per two-bit code value achieves a reduction from a 9-bit value for each of two pixels (2+7+2+7) to an 8-bit value (2+7+7). Since two pixels are encoded, the code preferably is determined by the larger of the two values. Alternating the association (odd or even) suitably avoids loss of data when the amplitude of one color, e.g., green, is much different from that of another color, e.g., blue.

As shown by FIG. 4b, the logic includes a three bit priority OR encoder 50 that determines the range of the CCD input data coming from a ten bit register, 52, for each pixel value, input 1 and input 3. A two-input select shifter 54 receives the code for the range of the data from the encoder 50 to determine the amount of shifting necessary and outputs the two-bit code and the seven bit data values appropriately in the 32-bit register 56. Similar functions are performed for inputs 2 and 4 with encoder 50', register 52', and shifter 54'. It should be appreciated that each ten bit input value would have its own memory, encoder, and shifter logic and that the block diagram of FIG. 4b has combined them for sake of a more simplified diagram. It should be further appreciated that alternate packing schemes are possible. By way of example, one code bit and seven data bits may be placed in each byte of a 32-bit word. For such a scheme, the decoder suitably reconstructs the code by extracting the two MSBs of each pair to compute the decoded values.

Another suitable compression scheme is described with reference to FIGS. 5a and 5b. This compression scheme is an eight-bit compression scheme based on a delta modulation whose range floats with the range of the CCD data. This method also works on odd and even pixels assuming a color Bayer pattern is used, while a grayscale system suitably works on successive pixels. When the MSB of the previous same color CCD data is a one, the encoder assumes the new CCD data is in the upper half of the light value range. When the next input CCD data falls within a differential value of +/−252 steps of the previous data, the encoded data becomes an eight bit value with a zero MSB, followed by a sign bit, and then six bits that give the difference between the third through eighth bit of the previous and current ten-bit same color CCD data. The loss of the last two bits results in a quantization step factor of four.

When the first two bits of the previous same color CCD data are a '01', the encoder assumes the new CCD data falls within the second quarter of the light value range, i.e., 256-511, and a comparison is made with the input CCD data. When the input CCD data is within +/−126 steps of the previous data, the encoded data becomes a '0' MSB, followed by a sign bit, and then six bits that give the difference between the fourth through ninth bits (b-g) of the previous and current ten-bit CCD data. The LSB is ignored. Thus, the quantization step factor is two.

When the previous same color CCD data has three MSBs of '000' or '001', the data falls within one half of the first quarter, either 0-127 or 128-255, of the light value range. A comparison with the input data determines whether the input CCD data is within +/− 63 steps of the previous data. When within the differential value, the encoded eight-bit data becomes a '0' MSB, followed by a sign bit, and then six bits that give the difference between the fifth through tenth bits (b-g) of the previous CCD data and the input CCD data. Since no low-order bits are lost, the quantization step factor is one.

Of course, for sharp edges in an image, e.g., a sharp change in light intensity from light to dark, the input data may not fall within one of the differential ranges. In such cases, the last three bits of the input data are suitably discarded. A one is placed as the MSB, and the next seven bits of the encoded value are the seven MSBs (a-g) of the CCD data. With the discarding of the three LSBs of the CCD data, the quantization step factor is 8.

FIG. 5b illustrates a block diagram of a hardware mechanism suitable for eight-bit compression. The hardware includes range checker logic 60, subtractor logic 62, and bit steering and assembly logic 64. The range checker logic 60 suitably receives the two MSBs of the previous same color CCD data value to set a range, e.g., a first range for 1x, a second range for 01, and a third range for 00. The range checker logic 60 further receives the four MSBs of the subtraction result from subtractor logic 62 to determine an out-of-range condition. For example, for the first range, the value should be 00 or 11, for the second range, the value should be 000 or 111, and for the third range, the value should be 0000 or 1111.

The outputs from the range checker logic 60 include a result shift value of 0, 1, or 2. Preferably, the result shift value selects which result bits are encoded. For the first range, the middle six bits are suitably encoded, i.e., the six bits following the two MSBs of the result data. For the second range, the six bits one position to the right of the two MSBs of the result data are suitably encoded. For the third range, the six bits two positions to the right of the two MSBs of the result data, i.e., the bottom six bits, are suitably encoded. The range checker logic 60 preferably also outputs an out-of-range indicator when the leading 0's or 1's of the result are not all 0's or 1's, as required and described above, to allow selection of alternate encoding.

The result shift value from the range checker logic 60 is preferably input to the bit steering and assembly logic 64. If the result shift value is not out-of-range, the value is used to select difference value bits (e.g., the delta values represented in the encoded values in FIG. 5a). The difference value bits are received from the subtractor logic 62, and selection occurs using six of the results bits as previously described. The sign result of the difference operation by the subtractor logic 62 is also preferably received by the bit steering and assembly logic 64 to determine the sign of the delta encoding. If there is an out-of-range indication, the appropriate bits of the data are selected (bits a-g, FIG. 5a), as well as the setting of the MSB. Thus, the seven MSBs of the current CCD data value received by the bit steering and assembly logic 64 are used to produce the alternate encoding when out-of-range conditions exist, as shown in FIG. 5a. Overall, the output from the bit steering and assembly logic 64 is preferably the encoded data value for both in-range and out-of-range conditions.

Referring again to FIG. 5a, also illustrated are decoded data for each of the ranges. Suitably, the LSB data indicated by "?" in FIG. 5a is determined by previous decodings. Since the system is a differencing compression system, there can be significant data in these bits carried over from previous decodings.

Similar to other differencing delta schemes, the 8-bit encoding scheme of the present invention may accumulate errors. However, since on average, errors tend to cancel out, the problem is typically minimized. Of course, there are situations when the errors do not cancel out, such as when using artificial data, including a ramp. Additional encoder steps may then be implemented to eliminate cumulative errors, if desired.

By way of example, in the basic encoder described with reference to FIGS. 5a and 5b, after a new value is received and the encoded value generated, the new value is stored into the old value register for use when the next same color value is received. Errors occur, because the new value stored in the 'old' register is not the same as the decoder generates. In order to eliminate errors accumulating, an additional computation is required to convert the encoder output into the correct next 'old value', which represents the exact same value that the decoder creates when it decodes the encoded value. In effect, the new value is encoded as described, then decoded, and the decoded value is then placed into the 'old' register.

FIG. 5c illustrates a block diagram for an error correcting circuit for use with the embodiment of FIGS. 5a and 5b. As shown, the circuit includes an encoder 68 coupled to a 'new' register 70 for storing a new value and to an 'old' register 72 for storing an old value. Further coupled to the encoder are a shifter 74, add/subtract unit 76, and a multiplexor (MUX) 78, which is coupled to an out-of-range indicator 80. In operation, for an out-of-range situation, the circuit preferably takes a new CCD value just encoded, and zeroes out the three LSBs. The modified value in then stored in 'old' register 72. For an in-range situation, the circuit suitably takes the lower six bits of the encoded value, and shifts the bits left according to the value still remaining in the 'old' register 72. Zeros are shifted in at the LSB with a left shift of two for the range 1xx, a left shift of one for the range 01x, and no shift for the range 00x. The shifted value is then added or subtracted via unit 76 as determined by the encoded sign bit from the value in the 'old' register 72. The maximum error at any given time is thus equal to the quantization step size.

In order to more particularly exemplify this, a numeric example is provided.

| | | |
|---|---|---|
| Nth ('old') value: | 01 0000 0000 | (range = 01x) |
| N+2 ('new') value: | 01 0000 0101 | (five higher) |
| Difference: | 00 0000 0101 | |
| Encoded value: | 0000 0010 | |
| Shift Back: | 0000 0100 | |
| Add to 'old' value: | 01 0000 0100 | (new 'old' value; decoded value with error) |
| N+2 ('old') value: | 01 0000 0100 | (one less due to error) |
| N+4 ('new') value: | 01 0000 1010 | (five higher from correct value) |
| Difference: | 00 0000 0110 | (six difference corrects error) |
| Encoded value: | 0000 0011 | |
| Shift back: | 0000 0110 | |
| Add to Old: | 01 0000 1010 | (new 'old' value; decode value with no error) |

If the N+2 ('new') value had simply been placed in the 'old' register 72, the 'old' register 72 would have contained 01 0000 0101 for the second step. While this would have resulted in the same difference of four for the second step, it would have resulted in a decoded value of eight more than the starting value rather than the correct ten more. Thus, in this simple ramp example, each step would increase the error using the simple 'old' update method.

Figure 6:
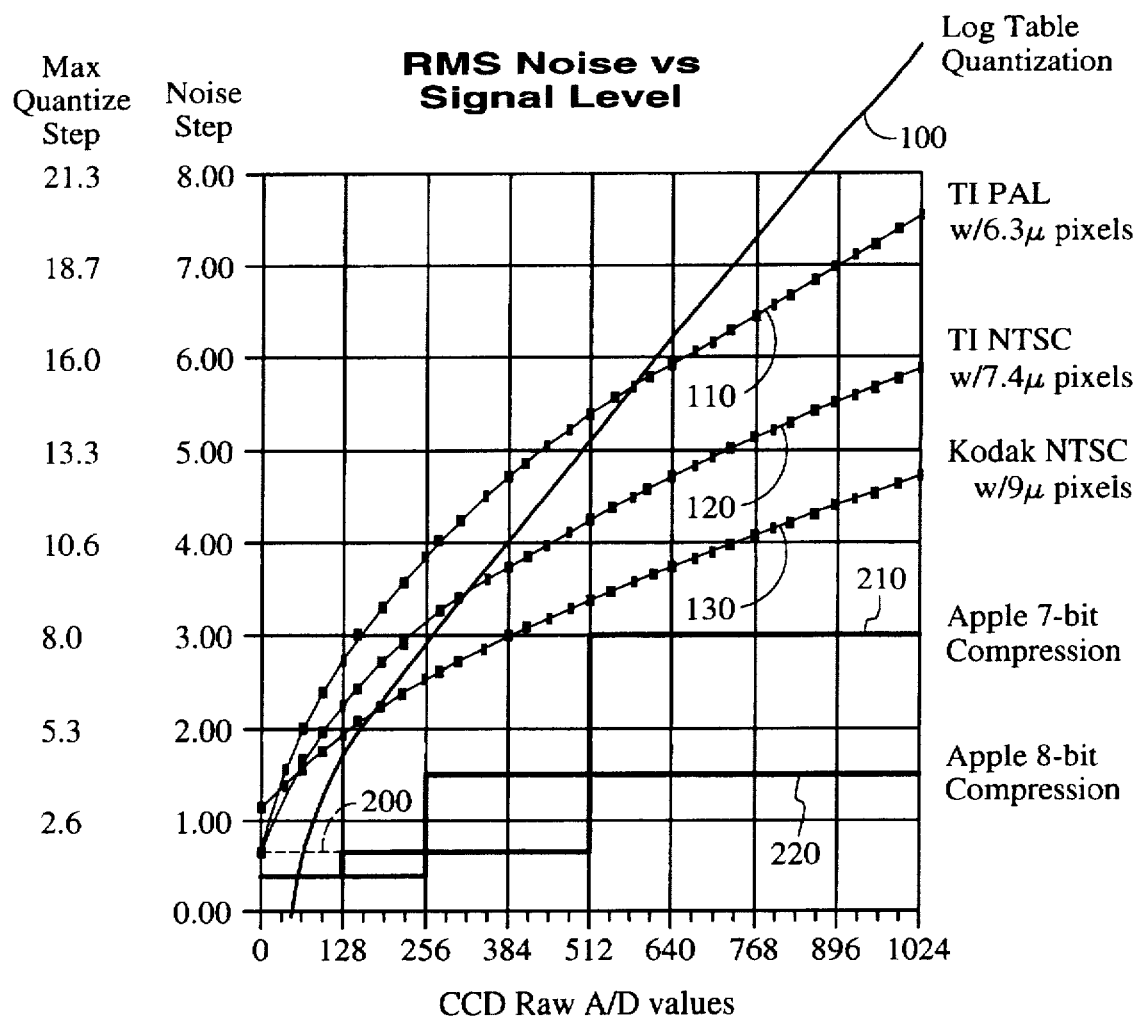
FIG. 6 illustrates the graph of FIG. 2 with the addition of plots for the compression schemes of the present invention.

FIG. 6 illustrates the graph of FIG. 2 with the addition of plots 200, 210, and 220. Plots 200, 210, and 220 respectively represent the noise graphs resulting from the six-bit, seven-bit, and eight-bit compression techniques in accordance with the present invention. The six-bit compression scheme has the same quantization step levels as the seven-bit compression scheme, except for the first-eighth, which has a quantization step value of two and is represented as the dashed line portion of plot 200. As illustrated by the compression plots, the present invention maintains image data at a level sufficient to avoid quantizing artifacts, while reducing the amount of data stored to eight bits of data per pixel. Further, the present invention advantageously provides efficient hardware mechanisms for producing the compressed image data. Additionally, the image data loses no discernible image quality, making the compression essentially lossless, with the employment of the ⅛ rule to determine maximum quantization levels suitable during compression. Thus, effective and productive compression is readily achieved.

Although the present invention has been described in accordance with the embodiments shown, one of ordinary skill in the art will recognize that there could be variations to the embodiment and those variations would be within the spirit and scope of the present invention. Accordingly, many modifications may be made by one of ordinary skill without departing from the spirit and scope of the present invention, the scope of which is defined by the following claims.

We claim:

1. A method for compressing digital image of more than a first predetermined number of bits into the first predetermined number of bits in a substantially lossless manner, the method comprising:

determining a plurality of ranges in which input image data falls;

comparing current image data with the plurality of ranges; and preserving six bits of the current image data based upon which of the plurality of ranges the current image data falls to encode the current image data as an image value comprising the first predetermined number of bits, wherein when six bits of data are preserved, the step of determining ranges identifies a first range when the most significant bit (NSB) of image data is a one, a second range when the two MSBs of the image data are zero-one, a third range when the three MSBs of image data are zero-zero-one, and a fourth range when the three MSBs of the image data are a zero-zero-zero.

2. The method of claim 1 wherein the first predetermined number of bits comprises eight bits.

3. The method of claim 1 wherein the input image data comprises analog-to-digital convertor values from 0–1023.

4. The method of claim 1 wherein when the image data is in the first range, the method further comprises preserving the six bits of image data that immediately follow the MSB, and encoding the preserved six bits in the image value after a one-one sequence.

5. The method of claim 1 wherein when the image data is in the second range, the method further comprises preserving the six bits immediately following the two MSBs, and encoding the preserved six bits in the image value after a one-zero sequence.

6. The method of claim 1 wherein when the image data is in the third range, the method further comprises preserving the six bits of image data immediately following the three MSBs, and encoding the preserved six bits in the image value after a zero-one sequence.

7. The method of claim 1 wherein when the image data is in the fourth range, the method further comprises preserving the six bits of image data immediately following the three MSBs, and encoding the preserved six bits in the image value after a zero-zero sequence.

8. A method for compressing digital image of more than a first predetermined number of bits into the first predetermined number of bits in a substantially lossless manner, the method comprising:

determining a plurality of ranges in which input image data falls;

comparing current image data with the plurality of ranges; and preserving seven bits of the current image data based upon which of the plurality of ranges the current image data falls to encode the current image data as an image value comprising the first predetermined number of bits, wherein when seven bits of data are preserved, the step of determining ranges identifies a first range when the three most significant bits (MSBs) of the image data are a zero-zero-zero, a second range when the two MSBs of the image data are zero-zero, a third range when the MSB of image data is zero, and a fourth range when the MSB of the image data is not a zero.

9. The method of claim 8 wherein when the image data is in the first range, the method further comprises preserving the seven bits of image data immediately following the three MSBs, and encoded the preserved seven bits as the seven least significant bits in the image value after a MSB code for a zero-zero sequence.

10. The method of claim 8 wherein when the image data is in the second range, the method further comprises preserving the seven bits of image data immediately following the two MSBs, and encoding the preserved seven bits as the seven least significant bits in the image value after a code for a zero-one sequence.

11. The method of claim 8 wherein when the image data is in the third range, the method further comprises preserving the seven bits of image data immediately following the MSB, and encoding the preserved seven bits as the seven least significant bits in the image value after a code for a one-zero sequence.

12. The method of claim 8 wherein when the image data is in the fourth range, the method further comprises preserving the seven bits of image data that are the seven MSBs, and encoding the preserved seven bits as the seven least significant bits in the image value after a code for a one-one sequence.

13. A method for compressing digital image of more than a first predetermined number of bits into the first predetermined number of bits in a substantially lossless manner, the method comprising:

determining a plurality of ranges in which input image data falls;

comparing current image data with the plurality of ranges; and preserving eight bits of the current image data based upon which of the plurality of ranges the current image data falls to encode the current image data as an image value comprising the first predetermined number of bits, wherein when eight bits of image data are preserved, the method further comprises determining in-range and out-of-range conditions between previous image data and current image data.

14. The method of claim 13 wherein when an in-range condition occurs, a delta modulation encoding is performed.

15. The method of claim 13 wherein when an out-of-range condition occurs, the image value comprises a one followed by the bit values for the seven MSBs of the current image data.

16. A system for compressing digital image of more than a first predetermined number of bits into the first predetermined number of bits in a substantially lossless manner, the system comprising:

means for determining a plurality of ranges in which input image data falls;

means for comparing current image data with the plurality of ranges, the means for comparing coupled to the means for determining; and means for preserving six bits of the current image data based upon which of the plurality of ranges the current image data falls to encode the current image data as an image value comprising the first predetermined number of bits, the means for preserving coupled to the means for determining and the means for comparing, wherein the means for determining and the means for comparing comprise a priority encoder coupled to a plurality of registers, and the means for preserving comprises at least one barrel shifter coupled to the priority encoder and the plurality of registers.

17. A system for compressing digital image of more than a first predetermined number of bits into the first predetermined number of bits in a substantially lossless manner, the system comprising:

means for determining a plurality of ranges in which input image data falls;

means for comparing current image data with the plurality of ranges, the means for comparing coupled to the means for determining; and means for preserving seven bits of the current image data based upon which of the plurality of ranges the current image data falls to encode the current image data as an image value comprising the first predetermined number of bits, the means for preserving coupled to the means for determining and the means for comparing, wherein the means for determining and means for comparing comprise a 3-bit OR priority encoder coupled to a plurality of registers, and the means for preserving comprises a two-input select shifter coupled to the 3-bit priority OR encoder and the plurality of registers.

18. A system for compressing digital image of more than a first predetermined number of bits into the first predetermined number of bits in a substantially lossless manner, the system comprising:

means for determining a plurality of ranges in which input image data falls;

means for comparing current image data with the plurality of ranges, the means for comparing coupled to the means for determining; and means for preserving eight bits of the current image data based upon which of the plurality of ranges the current image data falls to encode the current image data as an image value comprising the first predetermined number of bits, the means for preserving coupled to the means for determining and the means for comparing, wherein the means for determining and means for comparing comprises subtractor logic coupled to range checker logic, and the means for preserving comprises bit steering and assembly logic coupled to the subtractor logic and range checker logic.

* * * * *

UNITED STATES PATENT AND TRADEMARK OFFICE
CERTIFICATE OF CORRECTION

PATENT NO. : 5,790,705
DATED : August 4, 1998
INVENTOR(S) : Eric C. Anderson, et al.

It is certified that error appears in the above-identified patent and that said Letters Patent is hereby corrected as shown below:

In the claims:
Claim 1, column 9, line 22, "(NSB)" should read -- (MSB)--

Signed and Sealed this

Eighth Day of December, 1998

*Attest:*

BRUCE LEHMAN

*Attesting Officer*    *Commissioner of Patents and Trademarks*